(12) United States Patent
Chiang

(10) Patent No.: US 8,101,962 B2
(45) Date of Patent: Jan. 24, 2012

(54) CARRYING STRUCTURE OF SEMICONDUCTOR

(75) Inventor: Cheng-Feng Chiang, Gueishan Township, Taoyuan County (TW)

(73) Assignee: Kuang Hong Precision Co., Ltd., Gueishan Township (TW)

(*) Notice: Subject to any disclaimer, the term of this patent is extended or adjusted under 35 U.S.C. 154(b) by 120 days.

(21) Appl. No.: 12/574,223

(22) Filed: Oct. 6, 2009

(65) Prior Publication Data
US 2011/0079803 A1    Apr. 7, 2011

(51) Int. Cl.
*H01L 33/00* (2010.01)

(52) U.S. Cl. ............ 257/98; 257/99; 257/100; 257/675; 257/676; 257/677; 438/25; 438/26; 438/64; 438/69

(58) Field of Classification Search ............ 257/98–100, 257/675–677, 778; 362/202, 294, 313; 438/25–26, 438/64, 69, 106–127
See application file for complete search history.

(56) References Cited

U.S. PATENT DOCUMENTS

| | | | | |
|---|---|---|---|---|
| 4,593,485 A * | 6/1986 | Thillays | ............... | 40/452 |
| 5,534,718 A * | 7/1996 | Chang | ............... | 257/98 |
| 5,686,698 A * | 11/1997 | Mahadevan et al. | ............... | 174/522 |
| 5,826,324 A * | 10/1998 | Abe et al. | ............... | 29/597 |
| 5,923,084 A * | 7/1999 | Inoue et al. | ............... | 257/712 |
| 5,962,908 A * | 10/1999 | Beasom et al. | ............... | 257/520 |
| 6,091,145 A * | 7/2000 | Clayton | ............... | 257/724 |
| 6,274,924 B1 * | 8/2001 | Carey et al. | ............... | 257/676 |
| 6,376,902 B1 * | 4/2002 | Arndt | ............... | 257/678 |
| 6,407,411 B1 * | 6/2002 | Wojnarowski et al. | ............... | 257/99 |
| 6,427,324 B1 * | 8/2002 | Franklin et al. | ............... | 29/852 |
| 6,459,130 B1 * | 10/2002 | Arndt et al. | ............... | 257/432 |
| 6,469,537 B1 * | 10/2002 | Akram et al. | ............... | 324/754.1 |
| 6,541,800 B2 * | 4/2003 | Barnett et al. | ............... | 257/98 |
| 6,588,099 B2 * | 7/2003 | Yumoto | ............... | 29/848 |
| 6,645,783 B1 * | 11/2003 | Brunner et al. | ............... | 438/26 |
| 6,707,069 B2 * | 3/2004 | Song et al. | ............... | 257/79 |
| 6,806,583 B2 * | 10/2004 | Koay et al. | ............... | 257/787 |
| 6,919,586 B2 * | 7/2005 | Fujii | ............... | 257/100 |
| 6,919,637 B2 * | 7/2005 | He et al. | ............... | 257/758 |
| 6,929,975 B2 * | 8/2005 | Heinz et al. | ............... | 438/106 |
| 7,057,254 B2 * | 6/2006 | Bui et al. | ............... | 257/443 |
| 7,118,255 B2 * | 10/2006 | Galli | ............... | 362/373 |
| 7,161,189 B2 * | 1/2007 | Wu | ............... | 257/98 |

(Continued)

FOREIGN PATENT DOCUMENTS

JP    10168577    6/1998

*Primary Examiner* — N Drew Richards
*Assistant Examiner* — Ankush Singal
(74) *Attorney, Agent, or Firm* — Wang Law Firm, Inc.; Li K. Wang (57) ABSTRACT

A carrying structure of semiconductor includes a carrier made of a plastic material with a heat conduction region, each surface of the carrier has an interface layer formed on, and an electrically insulation circuit and a metal layer are defined on the interface layer. The insulation circuit is located on the surface of the heat conduction region and on an encircling annular region extended from two surfaces of the heat conduction region, and at the same time exposing parts of the carrier surface thereby splitting the metal layer on the interface layer into at least two electrodes. A thermal conductor formed in the heat conduction region has a LED chip adhered on it which has at least a contact point connected with the corresponding metal layer with a metal wiring so as to dissipate the heat generated by the chip rapidly with the thermal conductor.

15 Claims, 9 Drawing Sheets

U.S. PATENT DOCUMENTS

| | | | |
|---|---|---|---|
| 7,357,534 B2* | 4/2008 | Snyder | 362/294 |
| 7,524,087 B1* | 4/2009 | Aizar et al. | 362/267 |
| 7,532,479 B2* | 5/2009 | Ohno et al. | 361/719 |
| 7,635,915 B2* | 12/2009 | Xie et al. | 257/692 |
| 7,675,145 B2* | 3/2010 | Wong et al. | 257/676 |
| 7,696,590 B2* | 4/2010 | Waitl et al. | 257/434 |
| 7,699,500 B2* | 4/2010 | Takemoto et al. | 362/294 |
| 7,718,451 B2* | 5/2010 | Hofer et al. | 438/26 |
| 7,800,304 B2* | 9/2010 | Norfidathul et al. | 313/512 |
| 2003/0020077 A1* | 1/2003 | Horiuchi et al. | 257/81 |
| 2003/0199204 A1* | 10/2003 | Sauer et al. | 439/736 |
| 2004/0106301 A1* | 6/2004 | Teshirogi et al. | 438/778 |
| 2004/0165098 A1* | 8/2004 | Ikeda | 348/340 |
| 2004/0232435 A1* | 11/2004 | Hofer et al. | 257/99 |
| 2005/0121792 A1* | 6/2005 | Harada | 257/758 |
| 2005/0122713 A1* | 6/2005 | Hutchins | 362/205 |
| 2005/0176255 A1* | 8/2005 | Casey et al. | 438/694 |
| 2006/0062979 A1* | 3/2006 | Hara et al. | 428/209 |
| 2006/0124953 A1* | 6/2006 | Negley et al. | 257/99 |
| 2006/0133044 A1* | 6/2006 | Kim et al. | 361/704 |
| 2006/0138621 A1 | 6/2006 | Bogner et al. | |
| 2006/0239605 A1* | 10/2006 | Palen et al. | 385/14 |
| 2007/0257373 A1* | 11/2007 | Akram et al. | 257/774 |
| 2007/0269927 A1* | 11/2007 | Hofer et al. | 438/106 |
| 2008/0043444 A1* | 2/2008 | Hasegawa et al. | 361/717 |
| 2008/0099891 A1* | 5/2008 | Kato et al. | 257/666 |
| 2008/0101071 A1* | 5/2008 | Imai et al. | 362/294 |
| 2009/0040007 A1* | 2/2009 | Stenmark | 337/324 |
| 2009/0152003 A1* | 6/2009 | Feist et al. | 174/549 |
| 2010/0044866 A1* | 2/2010 | Harada | 257/751 |
| 2010/0097810 A1* | 4/2010 | Li | 362/345 |
| 2010/0110692 A1* | 5/2010 | Yu et al. | 362/294 |
| 2010/0151474 A1* | 6/2010 | Afanasyev et al. | 435/6 |
| 2010/0294538 A1* | 11/2010 | Chiang | 174/126.4 |
| 2010/0307799 A1* | 12/2010 | Chiang | 174/255 |

* cited by examiner

CARRYING STRUCTURE OF SEMICONDUCTOR

BACKGROUND OF THE INVENTION

1. Field of the Invention

The present invention relates to a carrying structure of semiconductor, and more particularly, to a semiconductor carrier in which a heat conduction region is formed (or it can be optionally formed on a thermal conductor) so as to form an electricity-supplying layer of prescribed thickness thereby acquiring a reflection and thermal conductive heat dissipation structure.

2. Description of the Prior Art

Recently, it has become a significant trend to use Cu, Ni, Ag, Au, and Cr on the semiconductor carrier to form the material for an interconnecting circuit, wherein Cu, Ni, Ag, Au and Cr have a relatively low resistance and higher electro migration resistance. The interconnected spots thereof are coated or separated out with Cu, Ni, Ag, Au or Cr by electroplating so as to fill the minor dents on the granulated carrier surface.

SUMMARY OF THE INVENTION

It is an object of the present invention to provide a semiconductor carrier which has a reflection cup using a metal of an excellent thermal conductivity to form a side wall, and the bottom surface thereof is connected to a thermal conductor so as to form a carrying structure of semiconductor having a good thermal conductivity.

It is another object of the present invention to provide a carrying structure of semiconductor, which can enlarge its heat dissipation area and has a thermal conductor.

It is another object of the present invention to provide a carrying structure of semiconductor, which can rapidly dissipate the internally stored heat outwards so as to prolong its lifespan.

It is another object of the present invention to provide a carrying structure of semiconductor, which can increase its heat dissipation passages and is of a heat dissipation structure.

It t is one more object of the present invention to provide a carrying structure of semiconductor which is electrically conductive and can have a freely designed electrically conduction circuit according to the carrier structure, namely, this freely designed circuit may be a three dimensional one with electrodes fabricated according to a creative process.

To achieve the above objects, the structure of the semiconductor carrier is made of a plastic material with a heat conduction region, each surface of the carrier has an interface layer, and an electrically insulation circuit and a metal layer are defined thereon. The insulation circuit is located on the surface of the heat conduction region and on an encircling annular region extended from two adjacent surfaces of the heat conduction region, and at the same time exposing parts of the carrier surface thereby splitting the metal layer on the interface layer into at least two electrodes. Furthermore, a thermal conductor has a LED chip adhered on it, the chip is connected with the corresponding metal layer from at least one contact point with a metal wiring so as to rapidly dissipate the heat generated by the chip through the thermal conductor.

BRIEF DESCRIPTION OF THE DRAWINGS

The drawings disclose an illustrative embodiment of the present invention, which serve to exemplify the various advantages and objects hereof, and are as follows.

DETAILED DESCRIPTION OF THE PREFERRED EMBODIMENT

Figure 1:
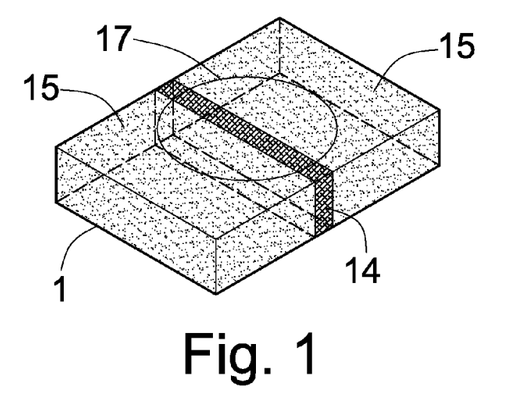
FIG. 1 is a perspective view of the present invention.
Figure 2:
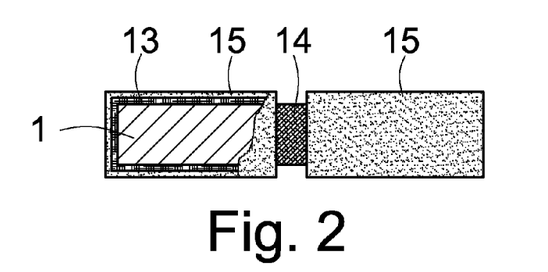
FIG. 2 is a partial side cross sectional view of FIG. 1.

Referring to FIG. 1 and FIG. 2, in an embodiment of the present invention the semiconductor carrier 1 is made of a plastic material and has a heat conduction region 17. On each surface of the carrier 1 is formed an interface layer 13 which defines an electrically insulation circuit 14 and a metal layer 15 thereon. The insulation circuit 14 is located on the heat conduction region 17 (or on its surface) and on at least an encircling annular region extended from two adjacent surfaces, whereas at the same time the insulation circuit 14 exposes parts of the carrier surface so as to form the metal layer 15 on the interface layer 13 into at least two electrodes (positive and negative). The carrier may be associated with following structure according to the user's different needs. Namely, the semiconductor carrier 1 made of a plastic material is formed with an interface layer 13 on each of its surfaces, and an insulation circuit 14 and a metal layer 15 are defined on the interface layer 13. The insulation circuit 14 is on an encircling annular region extended from two adjacent surfaces, while at the same time, the insulation circuit 14 exposes parts of the carrier surfaces so as to split the metal layer 15 on the interface layer 13 into at least two electrodes (positive and negative).

Figure 3:
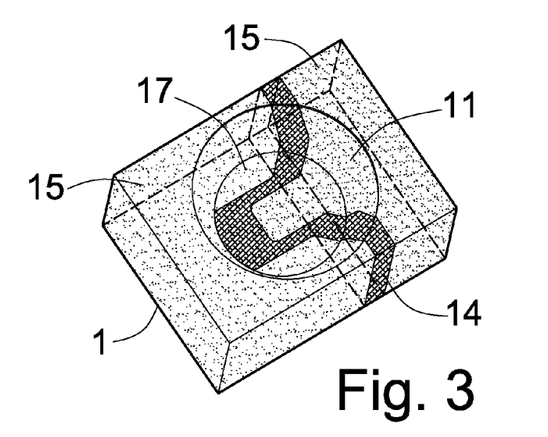
FIG. 3 is a perspective view showing the heat conduction region of the present invention is formed of a reflection cup.

As shown in FIG. 3, in a second embodiment, the heat conduction region 17 of the carrier 1 is a reflection cup 11 formed of a three dimensional heat conduction structure, and the heat conduction region 17 is extended from the surrounding of the carrier 1 to form a three dimensional heat conduction structure having at least a reflection surface.

Figures 4, 5:
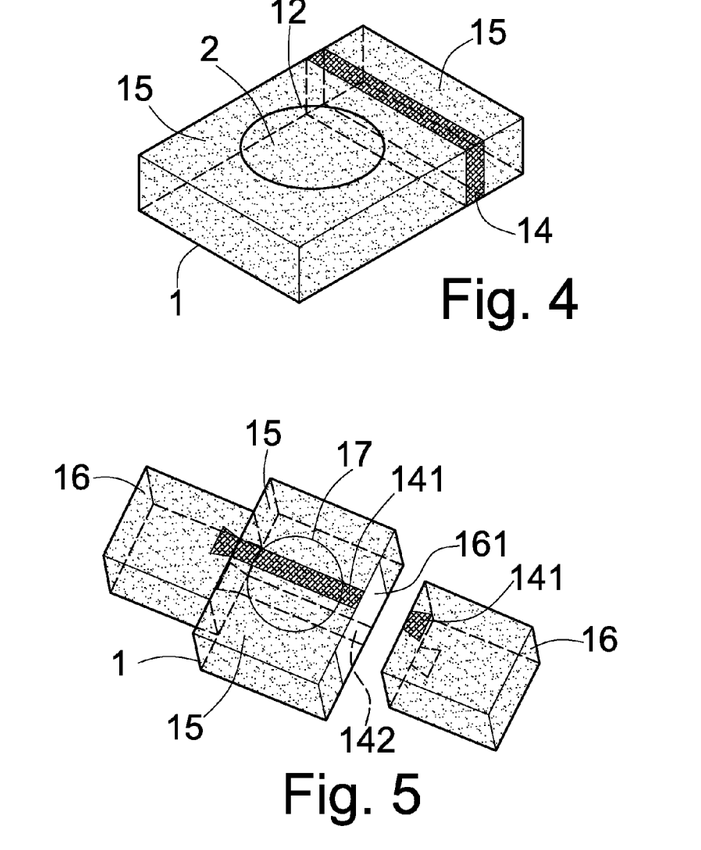
FIG. 4 is a perspective view showing at least one thermal conductor is formed in the heat conduction region in the carrier of the present invention.
FIG. 5 is a perspective view showing at least one side arm is formed with the carrier of the present invention.

As shown in FIG. 4, in a third embodiment, the heat conduction region is at least a heat conductor 2 formed inside of the carrier 1. The carrier 1 has a via hole 12 to accommodate the thermal conductor 2 in it and forming the top part of the thermal conductor 2 into the bottom of the reflection cup. The bottom of the thermal conductor 2 together with the bottom of the carrier 1 forms a bottom structure while the top part of the thermal conductor 2 becomes a heat-conducting surface to conduct heat.

Figure 9:
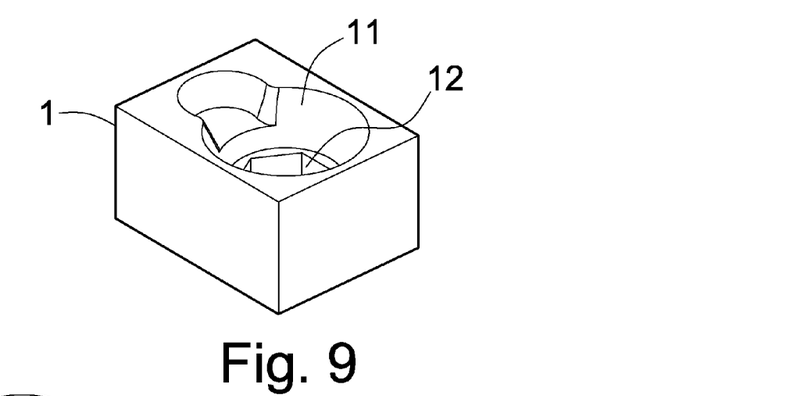
FIG. 9 is a perspective view of the carrier.

As shown in FIG. 9, in a fourth embodiment the heat conduction region 17 of the carrier is a reflection cup 11 formed of a three dimensional heat conduction structure extended from a thermal conductor 2. The reflection cup 11 has a via hole 12 formed at its bottom to accommodate the thermal conductor 2, and there is a contacting surface formed between the carrier 1 and the thermal conductor 2. As the top part of the thermal conductor 2 forms the bottom part of the reflection cup 11, the heat generated by the top part of the thermal conductor 2 can be conducted to its bottom part.

Figure 6:
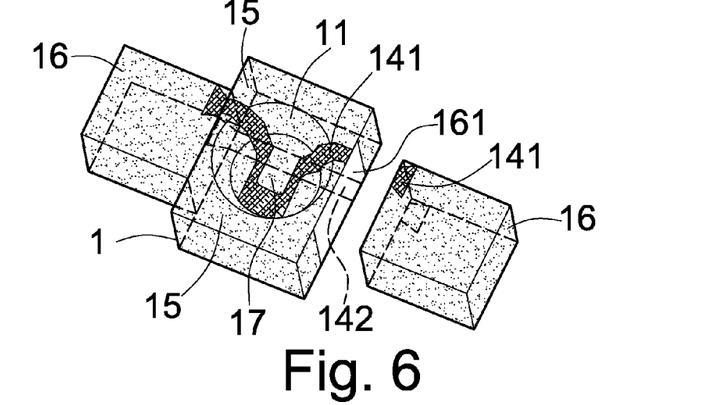
FIG. 6 is a perspective view showing the heat conduction region of the carrier which having side arm is formed of a reflection cup.
Figure 7:
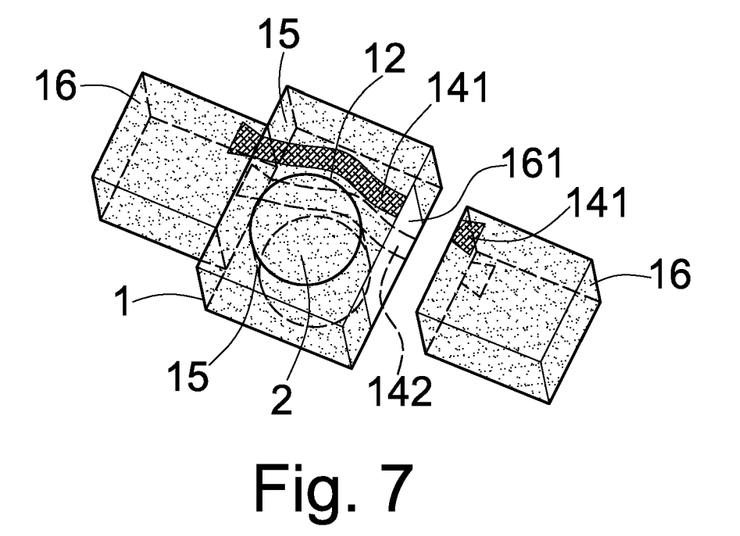
FIG. 7 is a perspective view showing a thermal conductor is formed in the carrier having side arms.
Figure 8:
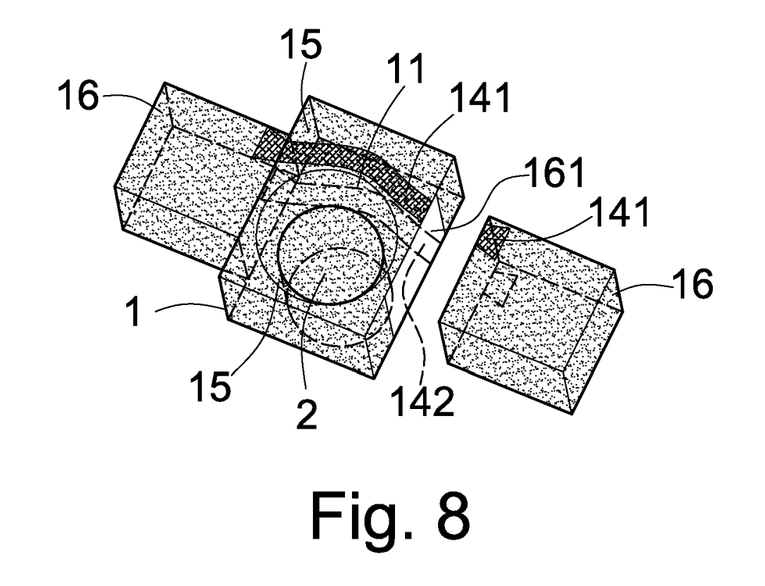
FIG. 8 is a perspective view showing the heat conduction region of the carrier having side arms is a thermal conductor with an extended reflection cup.

As shown in FIG. 5, in a fifth embodiment the carrier 1 at least has a side arm 16 extended laterally from one side. There is formed an interface layer 13 on each surface of the carrier 1 and the side arm 16, and then a first insulation circuit 141, a second insulation circuit 142 and a metal layer 15 are defined thereon. The side arm 16 divides the carrier 1 to form two divided surfaces 161 at both sides of the carrier 1 in contact with the carrier 1 so as to form an annular region among the divided surfaces 161, the first and the second insulation circuits 141, 142 thereby splitting the metal layer 15 on the interface layer 13 to form at least two electrodes. In the fifth embodiment the heat conduction region 17 of the carrier 1 can be a reflection cup 11 (see FIG. 6) formed by a three dimensional heat conductor structure, or at least a thermal conductor 2 (see FIG. 7) formed inside the carrier 1 or a reflection cup 11 (see FIG. 8) which being a three dimensional heat conductor structure extended from the thermal conductor 2. The reflection cup 11 has a via hole 12 at its bottom part to accommodate the thermal conductor 2.

Figure 10:
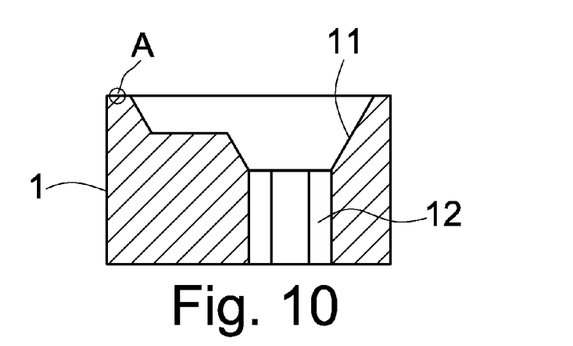
FIG. 10 and FIG. 10A are schematic views showing the surface of the carrier is granulated by etching or sand blasting.

The carrier 1 is fabricated from a single plastic material by injection molding. In FIG. 1 through FIG. 4 and FIG. 9, the carrier 1 ahs no extension side arm 16, whereas in FIG. 5 through FIG. 8, the carrier 1 at least has one side arm 16 extended at least from one side thereof. The heat conduction region 17 of the carrier 1 is (1) a plane as shown in FIG. 1 and FIG. 5; or (2) a reflection cup 11 which being a tilted reflection surface formed on the carrier 1 with an inclined angle 10° to 85° there between (see FIG. 3 and FIG. 6); or (3) a planar heat conduction region 17 which has at least one thermal conductor 2 inside the carrier 1 (see FIG. 4 and FIG. 7); or (4) a reflection cup 11 which being a three dimensional heat conductor structure extended from the thermal conductor 2 (see FIG. 8 through FIG. 10).

Figure 11:
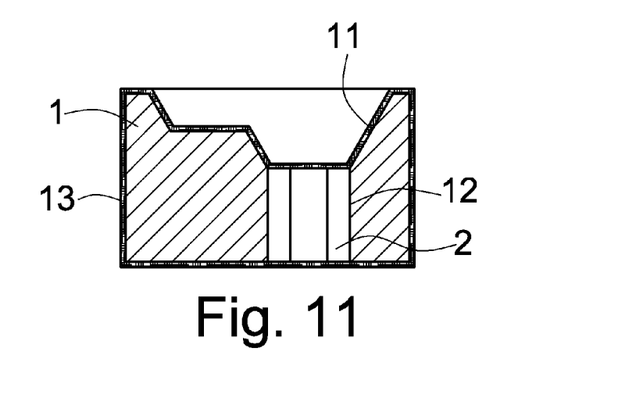
FIG. 11 is a schematic view showing an interface layer is formed on the surface of the carrier by electroless deposition.

Now, the formation of interface layer 13, the insulation circuit 14 and the metal layer 15 included in the thermal conductor 2 of the carrier 1 will be described below:

The interface layer 13 is formed on the surface of the carrier 1 by electroless deposition process, wherein the carrier 1 after being activated by the catalyst and transferred to electroless plating process is formed into an interface layer 13 containing chemical Ni or Cu on the surface of the carrier 1. As shown in FIG. 11, in case the carrier 1 contains a thermal conductor 2, an interface layer 13 can be simultaneously formed on the surfaces of the carrier 1 and the thermal conductor 2.

Figure 12:
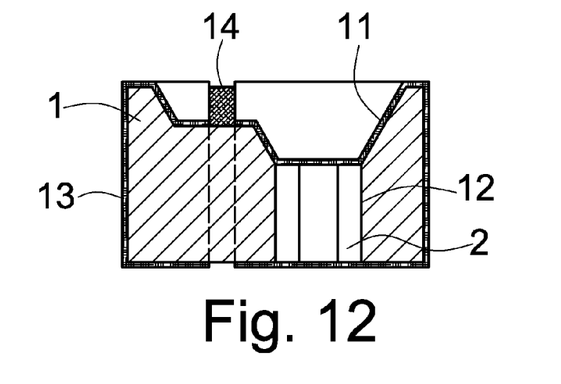
FIG. 12 is a schematic view showing an insulation circuit is formed on the carrier by ablating parts of the interface layer using laser beam process.

As shown in FIG. 12, the insulation circuit 14 is formed by ablating parts of the interface layer 13 using laser beam technique, wherein the laser beams includes $CO_2$ laser, Nd:YAG laser, Nd:$YVO_4$ laser, excimer laser, and fiber laser, the wave length is selected from 248 nm to 10600 nm.

Figure 13:
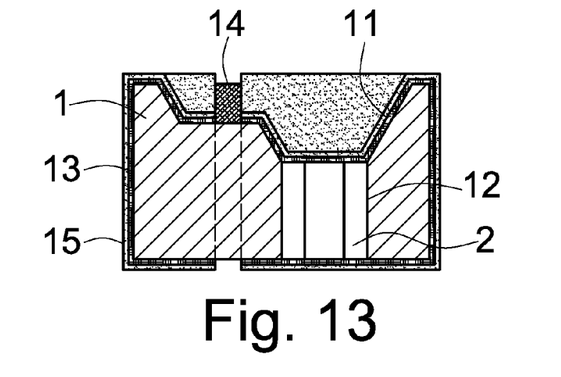
FIG. 13 is a schematic view showing the interface layer is a metal layer formed by conductive metal using electroplating process or chemical deposition process.
Figure 14:
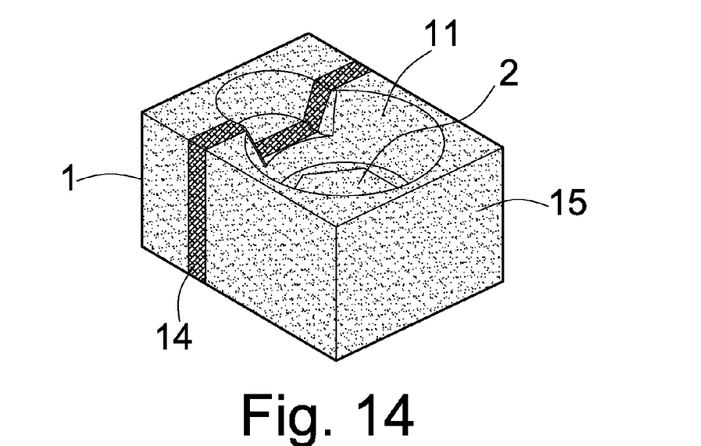
FIG. 14 is a perspective view of the semiconductor carrier of the present invention.

As shown in FIG. 13, electroplating or chemically depositing conductive metal to serve as an electricity supply layers for the interface layer 13 forms the metal layer 15. In electroplating process conductive metal is selectively deposited on the interface layer 13. The metal forming the layer 15 on the interface layer 13 includes any one of appropriate metals which being compatible with the structural material of the thermal conductor 2, preferably selected one from the group of electroplated or chemically deposited Cu, Ni, Ag, Au, Cr, or chemically replaced Au. The metal layer 15 can also improve the reflectivity of the reflection cup 11. The aforesaid conductive metals are easily obtainable high granular structural materials which serve the electricity supply layer to achieve a smoother surface and facilitate freely designing a conduction circuit, the metal layer 15, and highly reflective, highly heat conductive semiconductor carrier structure (see FIG. 14).

In the present invention, an interface layer 13 is formed by electroless deposition process on the surface of the conjoined carrier 1 and thermal conductor 2. Parts of the interface layer 13 are removed by laser beam and further formed an insulation circuit 14 encircling the interface layer 13, and metal layers 15 respectively at two sides of the insulation circuit 14. The metal layer 15 made of electroplating is for conjoining the carrier 1 and the thermal conductor 2 integrally, and the contact surface there between is filled with the metal layer 15.

Figure 15:
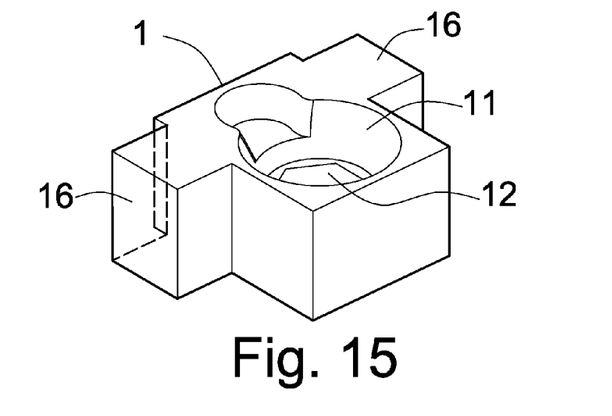
FIG. 15 is a perspective view of the carrier having a three dimensional heat conduction structure and a thermal conductor.
Figure 16:
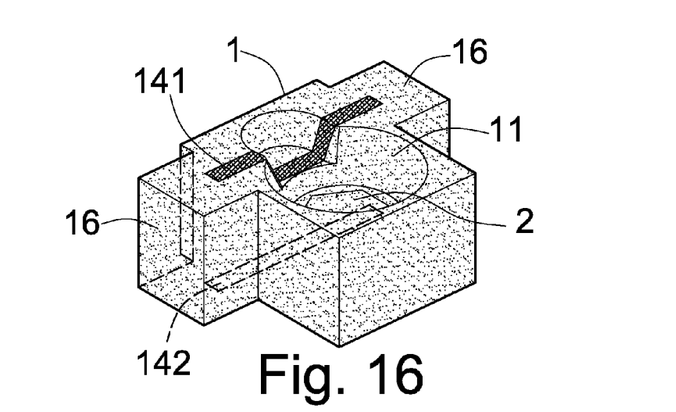
FIG. 16 is a perspective view of the carrier with its three dimensional heat conduction structure and the thermal conductor and a first and a second insulation circuits.

Referring to FIG. 15. Through FIG. 17, the drawings show a carrier 1 having a three dimensional heat conduction structure and a thermal conductor 2. An interface layer 13 is formed on the surface of the conjoined carrier 1 and the thermal conductor 2 by electroless deposition. Parts of the interface layer 13 are ablated by laser beam at the top and the bottom thereof, and a first and a second insulation circuits 141, 142 are formed by extending out of the edge of the carrier 1 to the surface region of a side arm 16 (see FIG. 16). Afterwards the side arm 16 is severed (separated from the carrier 1 by severing or punching) so as to form dividing surfaces 161 at two sides of the carrier 1 (see FIG. 17) such that the metal layer 15 is formed at each side of the insulation circuit 14 by the dividing surface 161 and the first and second insulation circuits 141, 142. The metal layer 15 formed by electroplating is used to conjoin the carrier 1 and the thermal conductor 2 integrally, and the contact surface there between is filled with the metal layer 15.

Figure 19:
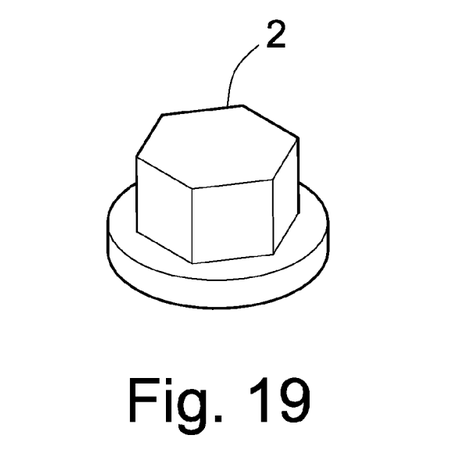
FIG. 19 is a perspective view of the thermal conductor.

Referring to FIG. 19, the upper diameter of the thermal conductor 2 is smaller than that of the lower one. When a LED chip 3 is adhered to the thermal conductor 2 in the way that is fixed on the positive metal layer 15 and at least a contact point is connected with the corresponding negative metal layer 15 via a metal conductor 31 such that heat generated by the chip 3 can be rapidly dissipated from the bottom of the thermal conductor 2.

Figure 20:
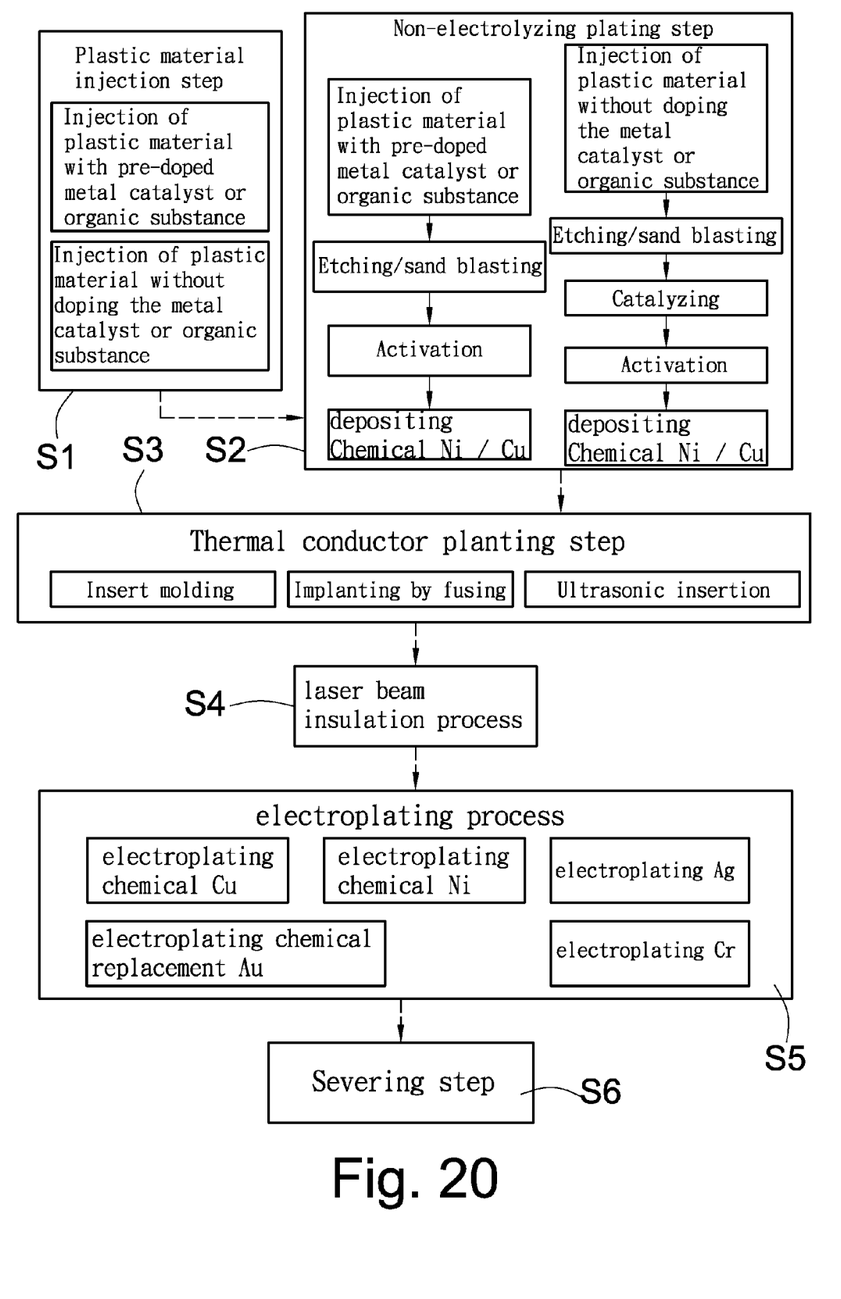
FIG. 20 is a first fabrication flow chart of the electronic components for the carrier according to the present invention.
Figure 21:
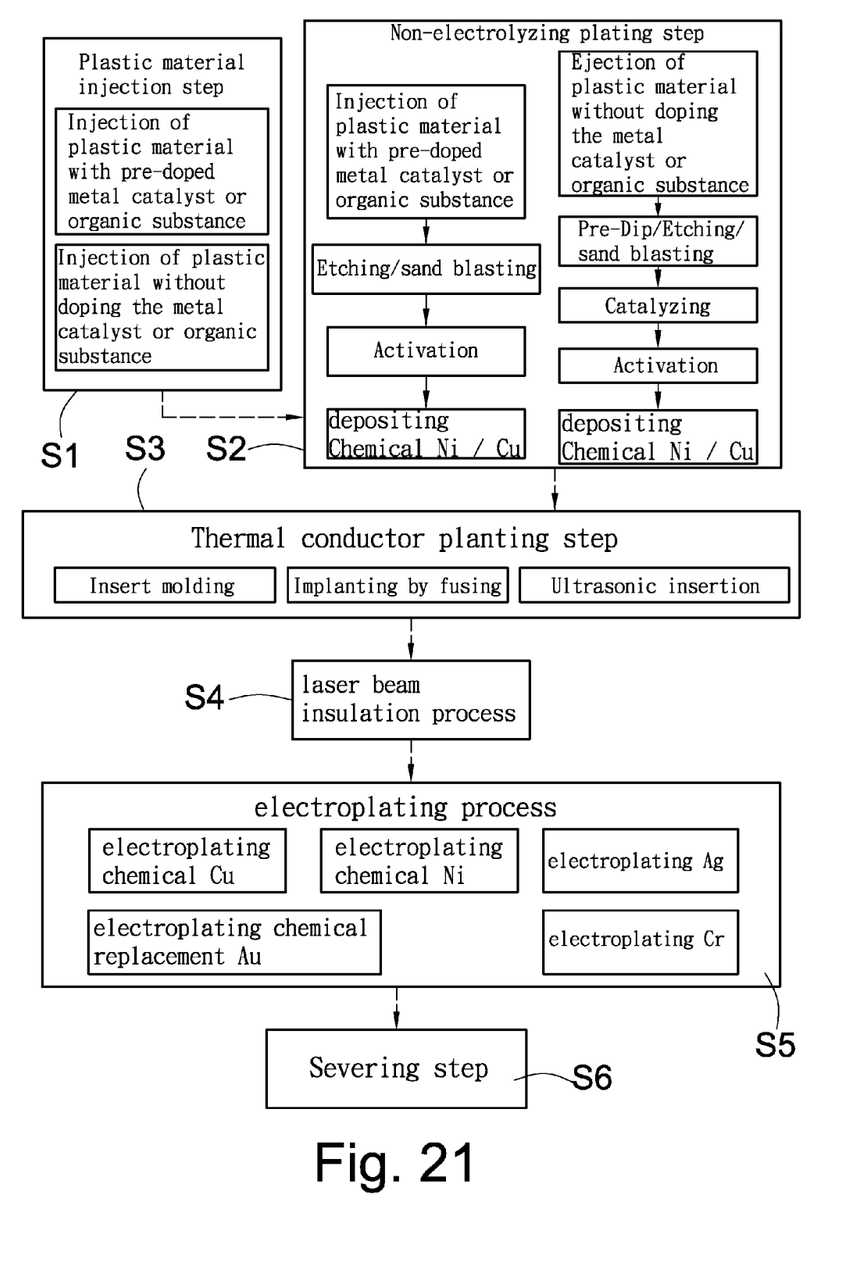
FIG. 21 is a second fabrication flow chart of the electronic components for the carrier according to the present invention.

FIG. 20 and FIG. 21 illustrate a preferable embodiment of fabrication method of the semiconductor carrier according to the present invention. The method comprises plastic material injection step S1, electroless plating step S2, thermal conductor 2 plating step S3 (omitting this step if the carrier 1 has no thermal conductor 2), laser beam insulation step S4, electroplating step S5 and severing step S6 in order so as to carry out the fabrication of the aforesaid Carrying Structure of Semiconductor. In the present invention this fabrication method is defined as Single-shot Planting and Laser (SPL) Process.

Plastic material injection step S1 provides at least a carrier 1 having a planar heat conduction region 17, or a carrier 1 having a three dimensional heat conduction structure, or a carrier 1 having a via hole 12, or a carrier 1 having a three dimensional heat conduction structure in connection with a via hole 12, or a carrier 1 having at least one side arm 16 extended at least from one side. The figure of the aforesaid three dimensional heat conduction structure, via hole 12 and side arm 12 can be changed by varying the mold figure. The carrier 1 is formed of a plastic or liquid crystal polymer material by injection process. The plastic materials are essentially selected from the widely used engineering plastics such as PA (polyamide), PBT, PET, LCP, PC, ABS and PC/ABS. The plastic material to form the carrier 1 is pre-doped with a metal catalyst or pre-doped with an organic substance. The metal catalysts or organic substances include essentially Pd, Cu, Ag, Fe, or the carrier 1 can be made of a plastic material without doped metal catalyst, or a plastic material without doped organic substance.

Figure 10A:
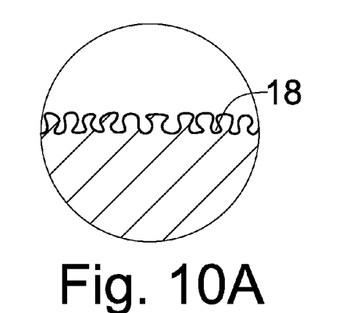

Electroless plating step S2: Forming an interface layer 13 on the carrier 1 to enclose it. An embryonic carrier 1 is produced after the plastic material injection step S1. As shown in FIG. 20, if the carrier 1 is made of plastic material pre-doped with a metal catalyst, or pre-doped with an organic substance, it goes through the etching process or sand blasting and activated to form a granulated surface 18 on it before the treatment of electroless plating (see FIG. 10A) so as to deposit chemical Ni or Cu on its surface thereby forming a metal interface layer 13. As shown in FIG. 21, if the carrier 1 is made of plastic material without pre-doping a meal catalyst, or the plastic material without pre-doping an organic substance, then it goes through the electroless plating process including pre-dipping, chemical etching or sand blasting to form a granulated surface 18. Besides, the surface of the carrier 1 is activated after being catalyzed. Afterwards the chemical Ni or Cu is deposited on the surface of the carrier 1 according to the electroless plating.

Thermal conductor 2 planting step S3: The thermal conductor 2 is planted into a via hole 12 in the carrier 1. The method includes (a) insert molding, (b) implanting by fusing, and (C) implanting by Ultrasonic insertion. If the thermal conductor 2 is planted by injection, the carrier 1 is fabricated in the manner of insert molding during step S1. The method of planting by fusing or ultrasonic insertion can be performed after step S1, or step S2, or after final electroplating step S5 is completed.

Laser beam insulation step S4: In this step S4 an insulation circuit 14 is formed on the interface layer 13 of the carrier 1, If the carrier 1 has no side arm 16, parts of interface layer 13 on the upper, lower and two side surfaces are ablated by laser beam such that the insulation circuit 14 is extended to encircle the carrier 1 (see FIG. 12). In case the carrier 1 at least has a side arm 16 extended at least from one side, a first and a second insulation circuits 141, 142 are formed on the interface layer 13, and the aforesaid two insulation circuits 141, 142 are formed ablating the interface layer 13 on the surface of the carrier 1 and extending beyond the edge of the carrier 1 to the surface region of the side arm 16, after that the insulation circuits 141, 142 can be formed on the interface layer 13 of the insulation circuit 14 according to actual needs (see FIG. 16).

The electroplating step S5: A metal layer 15 is formed on the interface layer 13 of the carrier 1, or on the interface layer 13 and the thermal conductor 2 so as to complete the fabrication of the semiconductor carrier. The metal layer 15 is formed by electroplating bath process using the metal selected one from the group Cu, Ni, Ag, Au, Cr, chemical replacement Au and providing a place for adhering a LED chip 3 and making electrical wiring and improving reflectivity, or for conducting electricity or heat.

Figure 17:
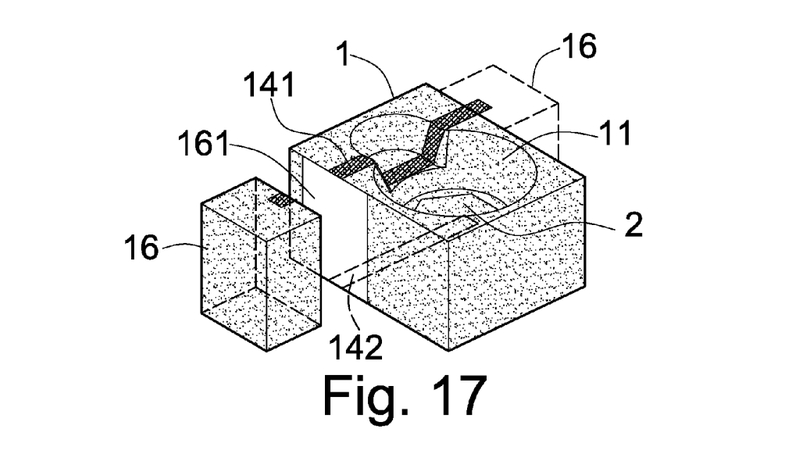
FIG. 17 is a perspective view of the carrier with the three dimensional heat conductor structure and the thermal conductor and having divided surfaces at both sides.
Figure 18:
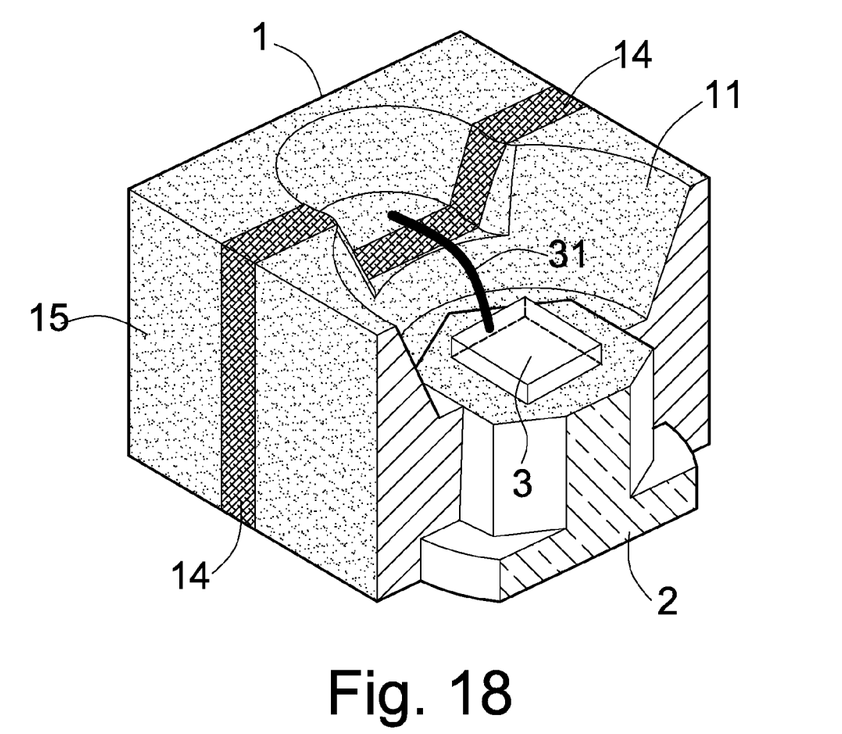
FIG. 18 is a fragmentary perspective view of the semiconductor carrier on whose thermal conductor a LED chip is adhered.

The severing step S6: As shown in FIG. 17, if the carrier 1 has a side arm 16, it is cut away such that the adhering surface 161 between the side arm 16 and the carrier 1, a first and a second insulation circuit 141, 142 partition the carrier 1 forming a positive and a negative electrodes thereby completing fabrication of the carrier structure.

It emerges from the description of the above embodiments that the invention has several noteworthy advantage compared with the conventional techniques, in particular:

The LED carrier constructed as such has a merit that its number and figure of the reflection surface is not limited, instead, it can be designed freely to accommodate any numbers of LEDs to arrange in any form. Electroplating or chemical deposition process can be utilized without any technical limitation to form the metal layer. The structure has an excellent electronic performance, high optical reflectivity, good heat conductivity and low fabrication cost.

The heat generated by LED may be dissipated via thermal conductor or the reflection cup, and the reflection cap can upgrade the brightness of LED.

The carrier is formed integrally without leaving any clearance. The structure is fabricated through precise and strict steps described above which are free from worry of leakage of packaging material. The seamless structure contributes to prolonging lifespan and avoiding the structural failure from expansion/shrinkage caused by heat cycle.

Many changes and modifications in the above-described embodiments of the invention can, of course, be carried out without departing from the scope thereof. Accordingly, to promote the progress in science and the useful arts, the invention is disclosed and is intended to be limited by the scope of the appended claims.

What is claimed is:

1. A carrying structure of semiconductor having a carrier made of a plastic material and forming an interface layer on each surface thereof, and defining an insulation path and a metal layer on said interface layer, wherein said insulation path is an annular region extended from two adjacent surfaces in an encircling form, and also by exposing parts of surface of said carrier so as to split said metal layer on said interface layer into at least two electrodes.

2. The structure of claim 1, wherein said carrier extends at least from one side to form at least one side arm, said carrier and said side arm form interface layer on each surface, and define a first and a second insulation paths and the metal layer on said carrier and said side arm, when said side arm divides said carrier, a dividing surface is formed at each of the two sides contacting said carrier such that the annular region is formed among said dividing surface and said first and second insulation paths thereby splitting said metal layer on said interface layer into the at least two electrodes.

3. The structure of claim 1, wherein said carrier is made of the plastic material containing a pre-doped metal catalyst or a liquid crystal polymer, or the plastic material containing a pre-doped organic substance or a liquid crystal polymer, said metal catalyst or organic substance essentially comprises Pd, Cu, Ag, Fe.

4. The structure of claim 1, wherein said carrier is made of the plastic material not containing any metal catalyst or liquid crystal polymer, or the plastic material not containing any organic substance or liquid crystal polymer.

5. The structure of claim 1, wherein said interface layer is directly deposited on the surface of said carrier by electroless plating, said insulation path is formed by ablating parts of said interface layer by laser beam, said metal layer is formed by depositing a conductive metal on said interface layer by electroplating or chemical deposition.

6. The structure of claim 1, wherein parts of said interface layer on the upper, side and lower surfaces of said carrier are ablated by laser beam to form said insulation path which partitions said carrier to form the at least two electrodes.

7. The structure of claim 1, wherein said carrier includes a heat conduction region and said heat conduction region is a reflection cup formed of a three-dimensional heat conductor structure.

8. The structure of claim 1, wherein said heat conduction region formed in said carrier is a reflection cup formed by a three dimensional heat conducting structure extended from a thermal conductor, said reflection cup has a via hole at a bottom part thereof to accommodate said thermal conductor such that a top part of said thermal conductor becomes the bottom part of said reflection cup.

9. The structure of claim 2, wherein after forming said metal layer, said side arm is separated from said carrier by severing process.

10. The structure of claim 2, wherein said insulation path is essentially formed by ablating the interface layer on the surface of said carrier by laser beam and extending beyond the edge of said carrier to the surface region of said side arm so as to form the first and the second insulation paths.

11. The structure of claim 2, wherein after severing said side arm from said carrier, said carrier is partitioned by an adhering surface, said first and said second insulation paths to form the at least two electrodes.

12. The structure of claim 7, wherein said heat conduction region has at least one thermal conductor inside of said carrier, and said thermal conductor has a heat conduction surface at its top part.

13. The structure of claim 12, wherein said thermal conductor further comprises a LED chip adhered thereon, and said chip is at least provided with a contact point to be connected with the corresponding metal layer using a metal wiring.

14. The structure of claim 8, wherein the interface layer is formed on a surface of said carrier and said thermal conductor by electroless plating, on said interface layer there is the insulation path formed by removing parts of said interface layer, and two metal layers each formed at one side of said insulation path, and said metal layer formed by electroplating or chemical deposition is for conjoining said carrier and said thermal conductor.

15. The structure of claim 14, wherein said structure further includes a contact surface between said carrier and said thermal conductor, and said contact surface is formed of filling with a metal layer.

* * * * *